United States Patent
Lee et al.

(10) Patent No.: US 10,656,491 B2
(45) Date of Patent: May 19, 2020

(54) LIQUID-CRYSTAL DISPLAY HAVING ALTERNATING SOURCE AND DRAIN ELECTRODE BRANCHES

(71) Applicant: Samsung Display Co., Ltd., Yongin-si, Gyeonggi-do (KR)

(72) Inventors: Gichang Lee, Yongin-si (KR); Yongjo Kim, Yongin-si (KR); Cholho Kim, Yongin-si (KR); Gunwoo Yang, Yongin-si (KR); Jihoon Yang, Yongin-si (KR); Yongwoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/642,102

(22) Filed: Jul. 5, 2017

(65) Prior Publication Data
US 2018/0011357 A1   Jan. 11, 2018

(30) Foreign Application Priority Data

Jul. 5, 2016   (KR) .......................... 10-2016-0085070

(51) Int. Cl.
*G02F 1/1368* (2006.01)
*G02F 1/1362* (2006.01)
(Continued)

(52) U.S. Cl.
CPC ...... *G02F 1/1368* (2013.01); *G02F 1/136286* (2013.01); *H01L 29/41733* (2013.01);
(Continued)

(58) Field of Classification Search
CPC combination set(s) only.
See application file for complete search history.

(56) References Cited

U.S. PATENT DOCUMENTS

| 8,405,088 B2 | 3/2013 | Ahn et al. |
| 2006/0033105 A1* | 2/2006 | Fujii ..................... G02F 1/1368 |
| | | 257/66 |

(Continued)

FOREIGN PATENT DOCUMENTS

| KR | 2003-0057636 | 7/2003 |
| KR | 10-2008-0059497 | 6/2008 |

(Continued)

*Primary Examiner* — Lauren Nguyen
(74) *Attorney, Agent, or Firm* — Lewis Roca Rothgerber Christie LLP

(57) ABSTRACT

A liquid-crystal display including: a gate line extending in a first direction; a gate electrode protruding from the gate line; a gate insulating layer arranged on the gate electrode; an active layer arranged on the gate insulating layer while being insulated from the gate electrode; a data line arranged on the active layer and extending in a second direction; a source electrode protruding from the data line, having a portion overlapping the gate electrode on a plane, and including a plurality of source electrode branches that are separate from each other; a drain electrode being separate from the source electrode, and including a plurality of drain electrode branches, each being arranged between two of the plurality of source electrode branches, and a drain electrode connecting part connecting the plurality of drain electrode branches; a pixel electrode defining a pixel region; a liquid-crystal layer arranged on the pixel electrode.

14 Claims, 11 Drawing Sheets

(51) Int. Cl.
  *H01L 29/417* (2006.01)
  *H01L 27/12* (2006.01)
  *H01L 29/786* (2006.01)
  *G02F 1/136* (2006.01)

(52) U.S. Cl.
  CPC .............. *G02F 1/136227* (2013.01); *G02F 2001/13606* (2013.01); *G02F 2201/122* (2013.01); *G02F 2201/124* (2013.01); *G02F 2201/40* (2013.01); *G02F 2202/103* (2013.01); *H01L 27/124* (2013.01); *H01L 27/1255* (2013.01); *H01L 29/78669* (2013.01)

(56) References Cited

U.S. PATENT DOCUMENTS

| | | | | |
|---|---|---|---|---|
| 2008/0290941 | A1* | 11/2008 | Ludwig | B82Y 10/00 330/253 |
| 2009/0195724 | A1* | 8/2009 | Park | H01L 29/41733 349/46 |
| 2010/0283955 | A1* | 11/2010 | Kim | G02F 1/1345 349/149 |
| 2011/0248266 | A1* | 10/2011 | Miyake | H01L 29/7869 257/57 |
| 2014/0028944 | A1* | 1/2014 | Kanzaki | G02F 1/1368 349/46 |
| 2014/0125904 | A1 | 5/2014 | Choung et al. | |

FOREIGN PATENT DOCUMENTS

| | | |
|---|---|---|
| KR | 10-2009-0085235 | 8/2009 |
| KR | 10-2011-0017247 | 2/2011 |
| KR | 10-2014-0058102 | 5/2014 |

\* cited by examiner

LIQUID-CRYSTAL DISPLAY HAVING ALTERNATING SOURCE AND DRAIN ELECTRODE BRANCHES

CROSS-REFERENCE TO RELATED APPLICATION

This application claims priority to and the benefit of Korean Patent Application No. 10-2016-0085070, filed on Jul. 5, 2016, in the Korean Intellectual Property Office, the disclosure of which is incorporated herein in its entirety by reference.

BACKGROUND

1. Field

One or more embodiments relate to a liquid-crystal display (LCD), and more particularly, to an LCD including a thin-film transistor (TFT) having an improved charging rate.

2. Description of the Related Art

Due to developments of various electronic devices such as mobile phones, personal digital assistants (PDAs), computers, large-scale televisions (TVs), or the like, there is an increasing demand for flat-panel displays that are applicable to these electronic devices. Among flat-panel displays, a liquid-crystal display (LCD) is advantageous due to its lower power consumption, easy display of moving pictures, high contrast ratio, or the like.

The LCD includes a liquid-crystal layer between two display panels, and displays an image in a manner that an electric field is applied to the liquid-crystal layer so as to change an alignment direction of liquid-crystal molecules and then to change polarization of incident light, and the change is associated with a polarizer so as to control whether to transmit incident light for each pixel, so that an image is displayed.

The LCD includes a display substrate on which a gate line and a data line cross each other, a thin-film transistor (TFT), a storage capacitor, etc., and when a gate-on voltage is applied to the gate line and thus the TFT is turned on, a data voltage applied via the data line is-charged in a pixel electrode via the TFT. Due to an electric field formed between the voltage changed in the pixel electrode and a common voltage applied to a common electrode, an alignment state of the liquid-crystal layer is determined.

SUMMARY

A thin-film transistor (TFT) according to the related art (i.e., a U-type TFT) has a structure in which a drain electrode has an I-shape and a source electrode having a U-shape surrounds the drain electrode, or in which a source electrode has an I-shape and a drain electrode having a U-shape that surrounds the source electrode. In the case of the U-type TFT, an efficiency of forming a channel region through which current flows between the source electrode and the drain electrode is low, and a value of parasitic capacitance between a gate electrode and the source electrode and a value of parasitic capacitance between the gate electrode and the drain electrode are large, so that a load of a gate line is increased and accordingly, a charging rate is decreased (e.g., a charging time is increased).

In order to solve several problems including the aforementioned problem, aspects of embodiments of the present disclosure are directed toward a liquid-crystal display (LCD) including a TFT having an improved charging rate, in which parasitic capacitance between a gate electrode and a source electrode and parasitic capacitance between the gate electrode and a drain electrode are reduced so that a load of a gate line is decreased (e.g., a charging time is decreased). However, the present disclosure may be embodied in many different forms and should not be construed as being limited to the embodiments set forth herein.

Additional aspects will be set forth in part in the description which follows and, in part, will be apparent from the description, or may be learned by practice of the presented embodiments.

According to one or more embodiments, a liquid-crystal display includes: a gate line extending in a first direction; a gate electrode protruding from the gate line; a gate insulating layer arranged on the gate electrode; an active layer arranged on the gate insulating layer while being insulated from the gate electrode, the active layer including a semiconductor material; a data line arranged on the active layer and extending in a second direction crossing the first direction; a source electrode protruding from the data line, having a portion overlapping the gate electrode on a plane, and including a plurality of source electrode branches that are separate from each other; a drain electrode being separate from the source electrode, and including a plurality of drain electrode branches, each being arranged between two of the plurality of source electrode branches, and a drain electrode connecting part (e.g., a drain electrode connector) connecting the plurality of drain electrode branches; a pixel electrode defining a pixel region having a first width in the first direction and a second width in the second direction, the second width being less than the first width, and arranged on the drain electrode so as to be electrically connected to the drain electrode; and a liquid-crystal layer arranged on the pixel electrode.

The active layer may include amorphous silicon.

The liquid-crystal display may further include a storage capacitor including a lower electrode and an upper electrode, wherein the lower electrode may be arranged at the same layer level as the gate electrode and the upper electrode may extend from the drain electrode.

The plurality of source electrode branches may be arranged while alternating with the plurality of drain electrode branches.

The plurality of source electrode branches and the plurality of drain electrode branches may be arranged at regular intervals.

The drain electrode connecting part and the data line may not overlap the gate electrode on a plane.

The drain electrode connecting part may extend in the second direction, and the plurality of source electrode branches may protrude from the data line in the first direction, and the plurality of drain electrode branches may protrude from the drain electrode connecting part in the first direction.

Each of the plurality of source electrode branches may include a first source electrode region being adjacent to the data line and having a third width, and a second source electrode region extending from the first source electrode region and having a fourth width, the fourth width being less than the third width, and each of the plurality of drain electrode branches may include a first drain electrode region being adjacent to the drain electrode connecting part and having a fifth width, and a second drain electrode region extending from the first drain electrode region and having a sixth width, the sixth width being less than the fifth width.

The second source electrode region and the second drain electrode region may overlap the gate electrode on the plane.

The second drain electrode region may not extend to overlap the first source electrode region in the second direction, and the second source electrode region may not extend to overlap the first drain electrode region in the second direction.

Each of the source electrode and the drain electrode may include: a lower layer including doped amorphous silicon; and an upper layer arranged on the lower layer, and including at least one metal layer.

Each of the source electrode and the drain electrode may directly contact the active layer.

The liquid-crystal display may further include a first conductive layer arranged at (e.g., in) the same layer level as the pixel electrode and having a portion that overlaps the data line.

The liquid-crystal display may further include a second conductive layer arranged at the same layer level as the pixel electrode and having a portion that overlaps the drain electrode connecting part.

The first conductive layer and the second conductive layer may be electrically connected to each other.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
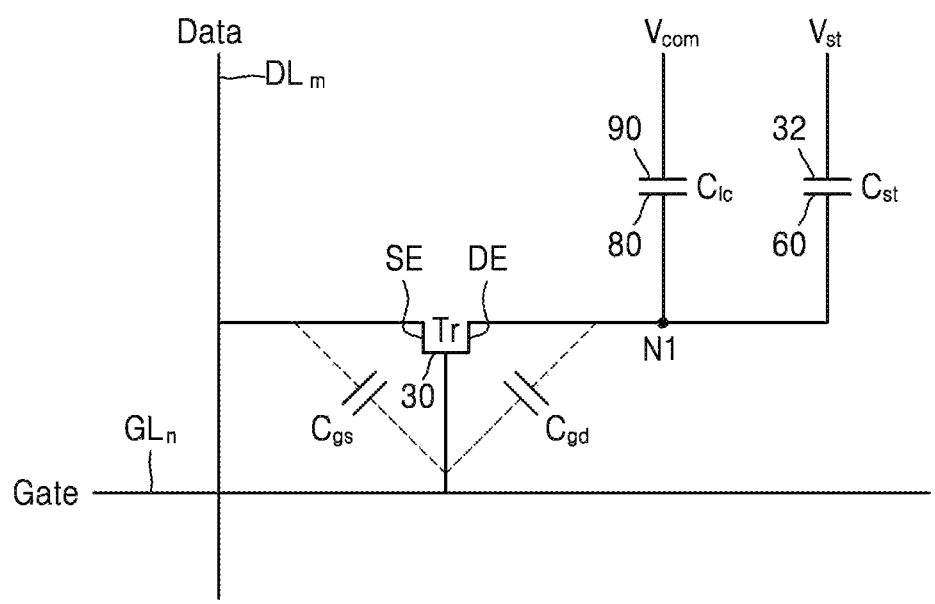
FIG. 1 is a circuit diagram of a pixel included in a liquid-crystal display (LCD), according to an embodiment.

As the disclosure allows for various changes and numerous embodiments, particular embodiments will be illustrated in the drawings and described in detail in the written description. Effects and features of the disclosure and methods of accomplishing the same may be understood more readily by reference to the following detailed description of certain embodiments and the accompanying drawings. The disclosure may, however, be embodied in many different forms and should not be construed as being limited to the embodiments set forth herein.

Reference will now be made in detail to the embodiments, examples of which are illustrated in the accompanying drawings, wherein like reference numerals refer to like elements throughout and redundant descriptions thereof are not provided here.

While such terms as "first," "second," etc., may be used to describe various components, such components must not be limited to the above terms. The above terms are used only to distinguish one component from another.

Throughout the specification, an expression used in the singular encompasses the expression of the plural, unless it has a clearly different meaning in the context.

Throughout the specification, it is to be understood that the terms such as "including" or "having," etc., are intended to indicate the existence of the features or components disclosed in the specification, and are not intended to preclude the possibility that one or more other features or components may exist or may be added.

In the drawings, for convenience of description, the thicknesses of elements may be exaggerated for clarity. For example, the thicknesses and sizes of elements in the drawings are arbitrarily shown for convenience of description, thus, the spirit and scope of the present disclosure are not necessarily defined and/or limited by the drawings.

As used herein, the term "and/or" includes any and all combinations of one or more of the associated listed items. Expressions such as "at least one of," when preceding a list of elements, modify the entire list of elements and do not modify the individual elements of the list.

FIG. 1 is a circuit diagram of a pixel included in a liquid-crystal display (LCD), according to an embodiment.

The LCD includes a display area for displaying an image, and a peripheral area outside the display area. A plurality of pixels are arranged in the display area, and each of the pixels may be driven by a driving circuit unit and a plurality of lines that apply an electrical signal to the driving circuit unit.

Referring to FIG. 1, the driving circuit unit and the plurality of lines may be arranged on a base substrate 10 (refer to FIG. 3) included in the LCD. The driving circuit unit may include a thin-film transistor (TFT) Tr and a storage capacitor $C_{st}$, and the plurality of lines may include a gate line $GL_n$ for applying a gate signal Gate to a gate electrode 30 of the TFT Tr, and a data line $DL_m$ for applying a data signal Data to a source electrode SE of the TFT Tr.

The gate line $GL_n$ and the data line $DL_m$ respectively extend in directions that cross each other. The LCD may include a plurality of the gate lines $GL_n$ and a plurality of the data lines $DL_m$, and a pixel may be arranged at each crossing of the gate line $GL_n$ and the data line $DL_m$.

Figure 3:
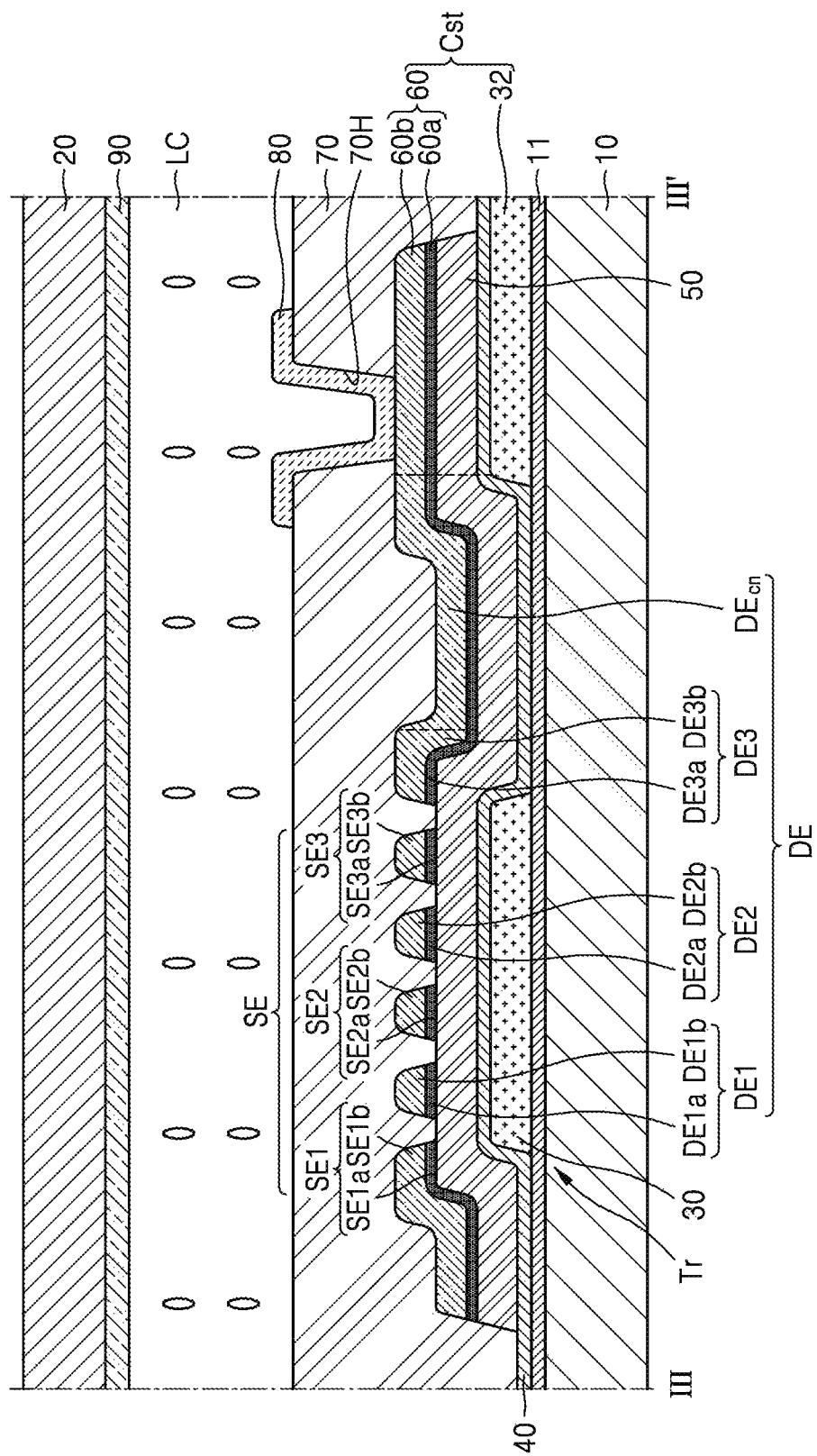
FIG. 3 is a cross-sectional view of the LCD, taken along line III-III' of FIG. 2.

When an on signal is applied to the gate electrode 30 of the TFT Tr, the data signal Data applied to the source electrode SE is transmitted to a drain electrode DE of the TFT Tr, and the drain electrode DE may be electrically connected to an upper electrode 60 (refer to FIG. 3) of the storage capacitor $C_{st}$ and a pixel electrode 80 (refer to FIG. 3). That is, the drain electrode DE, the upper electrode 60, and the pixel electrode 80 may be connected to a first node N1.

In order to apply an electric field to liquid crystals included in the LCD, the LCD may include the pixel electrode 80 and may further include a common electrode 90

(refer to FIG. 3) for applying a common voltage $V_{com}$. A liquid-crystal capacitor $C_{lc}$ may be formed by overlapping the pixel electrode 80 and the common electrode 90. In addition, the gate electrode 30 and the source and drain electrodes SE and DE of the TFT Tr may include overlapping portions on a plane, and due to the overlapping portions, a parasitic capacitance (of the gate electrode 30 and the source electrode SE) $C_{gs}$ and a parasitic capacitance (of the gate electrode 30 and the drain electrode DE) $C_{gd}$ may be formed.

Figure 2:
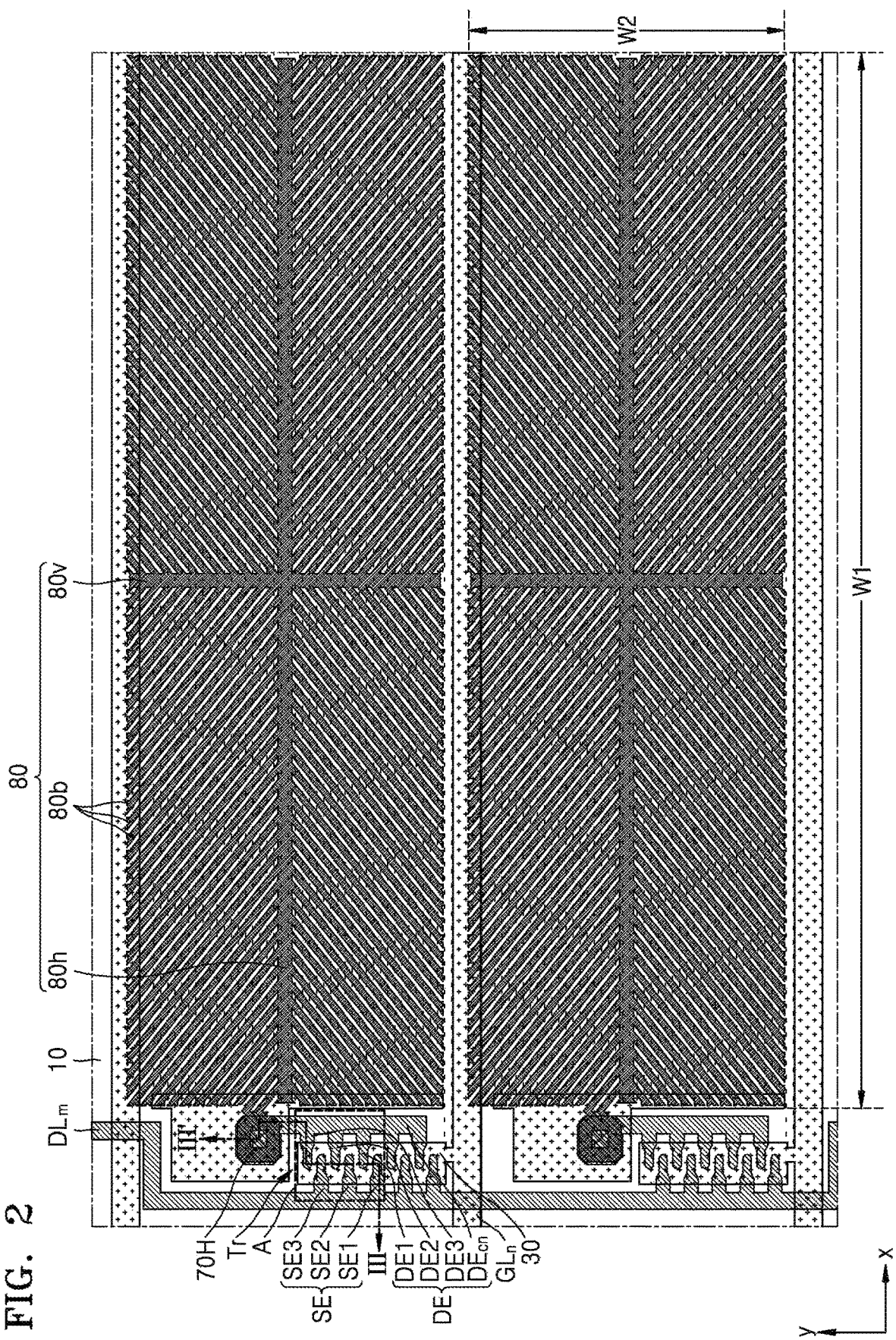
FIG. 2 is a plan view of an LCD, according to an embodiment.

FIG. 2 is a plan view of an LCD, according to an embodiment, and FIG. 3 is a cross-sectional view of the LCD, taken along line III-III' of FIG. 2.

Referring to FIGS. 2 and 3, the LCD includes the gate line $GL_n$ extending in a first direction x; the gate electrode 30 protruding (e.g., protruding in a second direction y) from the gate line $GL_n$; a gate insulating layer 40 arranged on the gate electrode 30; an active layer 50 including a semiconductor material and arranged on the gate insulating layer 40 while being insulated from the gate electrode 30; the data line $DL_m$ arranged on the active layer 50 and extending in the second direction y crossing the first direction x; the source electrode SE protruding from the data line $DL_m$, having a portion overlapping the gate electrode 30 on a plane, and including a plurality of source electrode branches that are separate from each other; the drain electrode DE being separate from the source electrode SE, and including a plurality of drain electrode branches, each being arranged between two of the plurality of source electrode branches, and a drain electrode connecting part (e.g., a drain electrode connector) $DE_{cn}$ connecting the plurality of drain electrode branches; the pixel electrode 80 defining a pixel region having a first width W1 in the first direction x and a second width W2 being less than the first width W1 and in the second direction y, and arranged on the drain electrode DE so as to be electrically connected to the drain electrode DE; and a liquid-crystal layer LC on the pixel electrode 80.

The base substrate 10 is arranged at the bottom of the LCD. The base substrate 10 may include a glass material, a plastic material, and/or the like, and may be divided into a plurality of pixel regions. FIG. 2 illustrates only two adjacent pixels, and in this regard, the LCD may include a plurality of pixels each being equal or similar to the pixels of FIG. 2 and may realize an image from the pixels.

The plurality of pixel regions may be defined by the pixel electrode 80. When viewing the pixel electrode 80 from the top as illustrated in FIG. 2, a rectangle having a smallest area externally contacting a boundary of the pixel electrode 80 is present, and a region of the rectangle may be defined as a pixel region. For example, referring to a lower part in FIG. 2, the pixel region has the first width W1 in the first direction x and the second width W2 in the second direction y. In this regard, the first width W1 is greater than the second width W2. That is, the pixel region refers to a rectangular region of which a side extending in the first direction x is a long side and of which a side extending in the second direction y is a short side.

The gate line $GL_n$ extending in the first direction x is arranged on the base substrate 10. That is, the gate line $GL_n$ may extend in the first direction x that is the same as an extending direction of the long side of the pixel region. The gate line $GL_n$ applies a gate signal Gate to the gate electrode 30 of the TFT Tr.

The gate electrode 30 protrudes from the gate line $GL_n$. For example, the gate electrode 30 may extend in the second direction y that is substantially perpendicular to the first direction x in which the gate line $GL_n$ extends. The first direction x and the second direction y may be substantially perpendicular to each other, but are not limited thereto. The gate electrode 30 and the gate line $GL_n$ may be concurrently or simultaneously formed by using a same material.

Referring to FIG. 3, the gate insulating layer 40 is arranged on the gate electrode 30. The gate insulating layer 40 may be a single layer or a multistack layer structure including an inorganic material. For example, the gate insulating layer 40 may be a single layer including silicon nitride ($SiN_x$).

The active layer 50 that is electrically insulated from the gate electrode 30 due to the gate insulating layer 40 is arranged on the gate insulating layer 40. The active layer 50 includes a semiconductor material. According to the present embodiment, the active layer 50 may include amorphous silicon.

The data line $DL_m$ extending in the second direction y crossing the first direction x is arranged over the active layer 50. That is, the data line $DL_m$ may extend in a same direction as the extending direction of the short side of the pixel region. Referring to FIG. 2, the data line $DL_m$ is arranged extending in the second direction y. As described above, the data line $DL_m$ may apply a data signal Data to the source electrode SE of the TFT Tr. While the data line $DL_m$ mainly extends in the second direction y, the data line $DL_m$ may have a portion that is bent to be parallel to the first direction x.

The source electrode SE is arranged having a portion thereof overlapping the gate electrode 30 on a plane and including a plurality of source electrode branches SE1, SE2, and SE3 (also referred to as the first, second, and third source electrode branches SE1, SE2, and SE3) that protrude from the data line $DL_m$ and are separate from each other. The source electrode SE may be formed from the same material layer as the data line $DL_m$. Referring to FIG. 2, a plurality of source electrode branches are arranged to extend in the first direction x that is substantially perpendicular to the second direction y in which the data line $DL_m$ extends. While FIG. 2 illustrates five source electrode branches as an example, the present disclosure is not limited thereto. FIG. 3 illustrates a cross-sectional view of only three source electrode branches from among the five source electrode branches. Each of the source electrode branches SE1, SE2, and SE3 may protrude in the first direction x that is substantially perpendicular to the extension direction of the data line $DL_m$.

Figure 4:
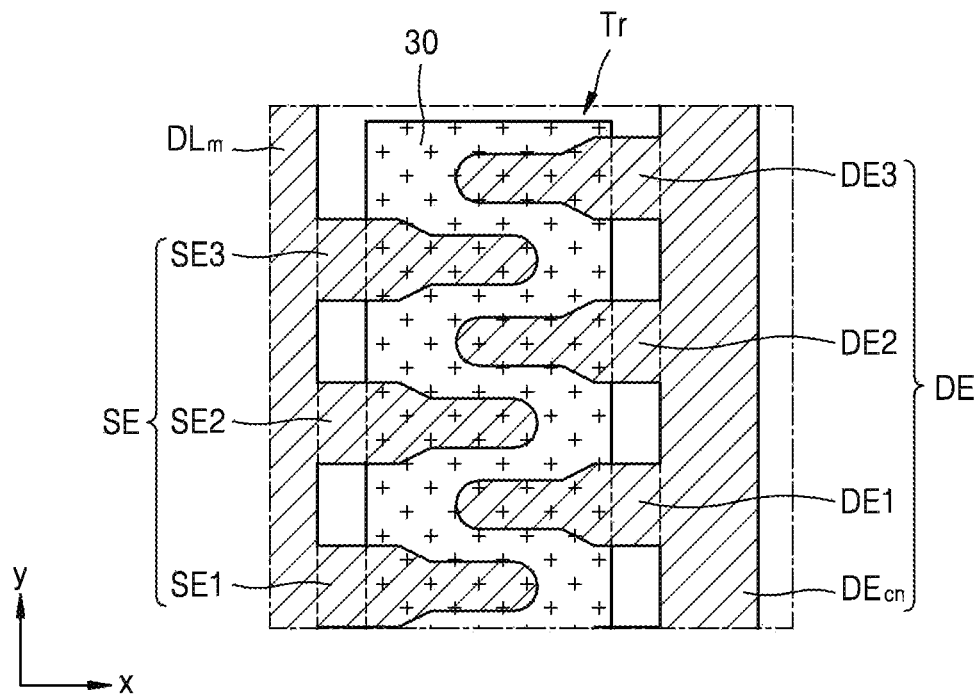
FIGS. 4 and 5 are magnified plan views of a portion A of FIG. 2.
Figure 5:
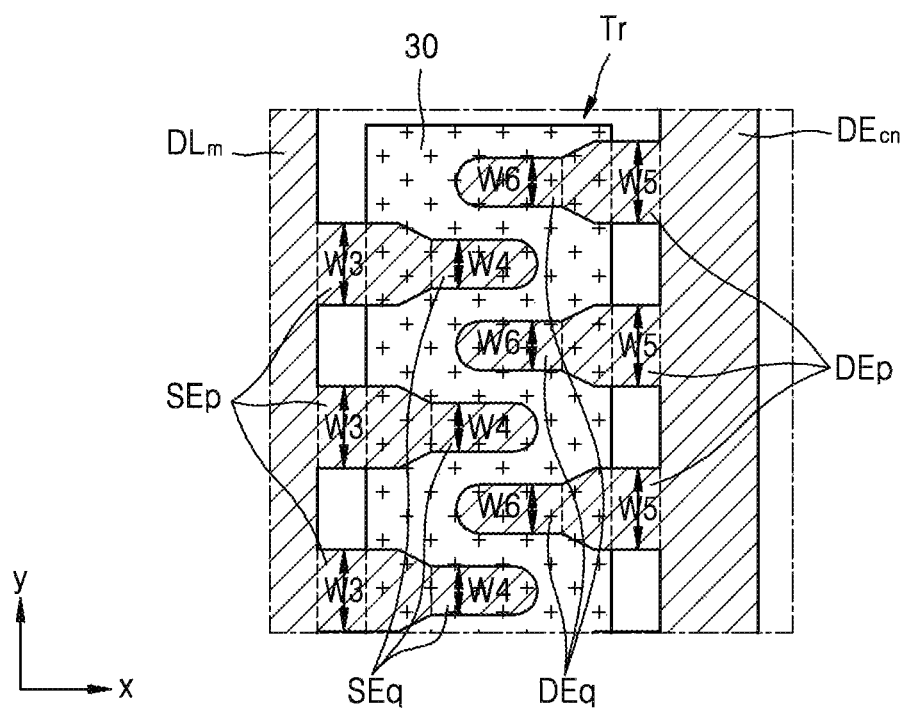

FIGS. 4 and 5 are magnified plan views of a portion A of FIG. 2. Referring to FIG. 4, the drain electrode DE that is separate from the source electrode SE and includes a plurality of drain electrode branches DE1, DE2, and DE3 (also referred to as the first, second, and third drain electrode branches DE1, DE2, and DE3), each being arranged between two of the plurality of source electrode branches SE1, SE2, and SE3, and the drain electrode connecting part $DE_{cn}$ connecting the plurality of drain electrode branches DE1, DE2, and DE3 is arranged. Referring to FIGS. 2 and 4, the plurality of drain electrode branches DE1, DE2, and DE3 may be arranged to extend in a direction being perpendicular to the second direction y in which the drain electrode connecting part $DE_{cn}$ extends. While FIGS. 3 through 5 illustrate three source electrode branches and three drain electrode branches as an example, the present disclosure is not limited thereto. The plurality of drain electrode branches DE1, DE2, and DE3 are all connected to the drain electrode connecting part $DE_{cn}$ but are separate from each other. The drain electrode connecting part $DE_{cn}$ may be integrally formed with the drain electrode DE. The drain electrode DE may be formed from the same material layer as the source electrode SE.

According to the present embodiment, the plurality of source electrode branches SE1, SE2, and SE3 and the plurality of drain electrode branches DE1, DE2, and DE3 may be arranged alongside each other. Referring to FIGS. 2 and 4, each of the plurality of drain electrode branches DE1, DE2, and DE3 is arranged in a space between two of the plurality of source electrode branches SE1, SE2, and SE3. That is, when viewing the LCD from the top as illustrated in FIG. 2, the plurality of drain electrode branches DE1, DE2, and DE3 and the plurality of source electrode branches SE1, SE2, and SE3 are arranged alongside each other as interlocked fingers. That is, referring to the cross-sectional view of FIG. 3, the plurality of source electrode branches SE1, SE2, and SE3 and the plurality of drain electrode branches DE1, DE2, and DE3 are alternately arranged.

Referring to FIGS. 2, 4, and 5, a branch at the top of drawings is the drain electrode branch DE3 and a branch at the bottom of the drawings is the source electrode branch SE1, but the present disclosure is not limited thereto. That is, the branch at the top may be a source electrode branch and the branch at the bottom may be a drain electrode branch. Alternatively, branches at the top and bottom may be of the same electrode. Therefore, when the number of drain electrode branches is n, the number of source electrode branches may be any one of n−1, n, and n+1 (where, n is an integer being equal to or greater than 2).

According to the present embodiment, the plurality of source electrode branches SE1, SE2, and SE3 and the plurality of drain electrode branches DE1, DE2, and DE3 may be arranged at regular intervals. Referring to FIG. 4, the plurality of source electrode branches SE1, SE2, and SE3 and the plurality of drain electrode branches DE1, DE2, and DE3 are alternately arranged at regular intervals. By doing so, a width of a channel region between the source electrode SE and the drain electrode DE may be constant, so that a current driving capability from the source electrode SE to the drain electrode DE may be increased or maximized.

According to the present embodiment, the data line $DL_m$ and the drain electrode connecting part $DE_{cn}$ may not overlap the gate electrode 30 on a plane. Referring to FIG. 4, the gate electrode 30 overlaps the source electrode SE (i.e., the source electrode branches SE1, SE2, and SE3) and the drain electrode DE (i.e., the drain electrode branches DE1, DE2, and DE3) on a plane, and does not overlap the data line $DL_m$ and the drain electrode connecting part $DE_{cn}$. When the gate electrode 30 is formed in this manner, a value of the parasitic capacitance $C_{gd}$, which is caused due to the gate electrode 30 and the drain electrode DE, and a value of the parasitic capacitance $C_{gs}$, which is caused due to the gate electrode 30 and the source electrode SE, may be decreased.

According to the present embodiment, the drain electrode connecting part $DE_{cn}$ extends in the second direction y, and the plurality of source electrode branches SE1, SE2, and SE3 may protrude from the data line $DL_m$ in the first direction x, and the plurality of drain electrode branches DE1, DE2, and DE3 may protrude from the drain electrode connecting part $DE_{cn}$ in the first direction x. When the drain electrode connecting part $DE_{cn}$ is arranged in parallel to the data line $DL_m$ without a portion crossing (e.g., extending in a direction perpendicular) to the extension direction of the data line $DL_m$, each device may be efficiently arranged.

According to the present embodiment, the plurality of source electrode branches SE1, SE2, and SE3 may each include a first source electrode region SEp being adjacent to the data line $DL_m$ and having a third width W3, and a second source electrode region SEq extending from the first source electrode region SEp and having a fourth width W4, the fourth width W4 being less than the third width W3, and the plurality of drain electrode branches DE1, DE2, and DE3 may each include a first drain electrode region DEp being adjacent to the drain electrode connecting part $DE_{cn}$ and having a fifth width W5, and a second drain electrode region DEq extending from the first drain electrode region DEp and having a sixth width W6, the sixth width W6 being less than the fifth width W5.

Referring to FIG. 5, the plurality of source electrode branches SE1, SE2, and SE3 and the plurality of drain electrode branches DE1, DE2, and DE3 may each have a convex shape (凸) or a bowling pin shape. In this regard, the second source electrode region SEq and the second drain electrode region DEq of which widths are small may have portions that overlap each other in the second direction y. Due to this shape, a width of the channel region may become small. Therefore, since a space is efficiently used, a current driving capability of the TFT Tr may be increased without decreasing an aperture ratio. This will be described below.

According to the present embodiment, the second source electrode region SEq and the second drain electrode region DEq may overlap the gate electrode 30 on a plane. A channel region of the active layer 50 is formed between the second source electrode region SEq and the second drain electrode region DEq, and when the gate electrode 30 overlaps the channel region on a plane as described above, leakage current due to light may be prevented and accordingly, an efficiency of the TFT Tr may be improved.

According to the present embodiment, the second drain electrode region DEq may not extend near the first source electrode region SEp (i.e., the second drain electrode region DEq does not extend to overlap the first source electrode region SEp in the second direction y, or does not extend to pass a line extending in the second direction y and defined by the boundary separating the second source electrode region SEq and the first source electrode region SEp), and the second source electrode region SEq may not extend near the first drain electrode region DEp (i.e., the second source electrode region SEq does not extend to overlap the first drain electrode region DEp in the second direction y, or does not extend to pass a line extending in the second direction y and defined by the boundary separating the second drain electrode region DEq and the first drain electrode region DEp). Referring to FIG. 5, the second drain electrode region DEq does not overlap the first source electrode region SEp in the second direction y, and the second source electrode region SEq does not overlap the first drain electrode region DEp in the second direction y. By doing so, a distance between the source electrode SE and the drain electrode DE is reduced or minimized, so that the width of the channel region may become small and thus the current driving capability of the TFT Tr may be increased. In addition, the parasitic capacitance $C_{gs}$ between the gate electrode 30 and the source electrode SE, and the parasitic capacitance $C_{gd}$ between the gate electrode 30 and the drain electrode DE are decreased, so that a delay of the data line $DL_m$ may be reduced and thus a charging rate may be improved.

It is should be apparent that a shape of each of the plurality of source electrode branches SE1, SE2, and SE3 and each of the plurality of drain electrode branches DE1, DE2, and DE3 is not limited to a convex shape (凸), and thus may be flat (-), semicircular, semioval, triangular, and/or the like. Referring to FIGS. 4 and 5, shapes of the plurality of source electrode branches SE1, SE2, and SE3 and the plurality of drain electrode branches DE1, DE2, and DE3 are symmetrical in the first direction x, but the present disclosure is not limited thereto, and any suitable structure having an improved efficiency of forming a channel region may be employed.

Each of the plurality of source electrode branches SE1, SE2, and SE3 and each of the plurality of drain electrode branches DE1, DE2, and DE3 may have a same shape and size. Therefore, the third width W3 of the first source electrode region SEp and the fifth width W5 of the first drain electrode region DEp may have a substantially same value. In addition, the fourth width W4 of the second source electrode region SEq and the sixth width W6 of the second drain electrode region DEq may have a substantially same value.

As in the related art, if the source electrode SE has an I-shape, and the drain electrode DE has a U-shape surrounding the source electrode SE, only an inner portion of the drain electrode DE which faces the source electrode SE contributes to forming the channel region, and an outer portion thereof does not contribute to forming the channel region. Unlike the related art, as in the present disclosure, when the plurality of source electrode branches SE1, SE2, and SE3 and the plurality of drain electrode branches DE1, DE2, and DE3 are alternately arranged, most portions of the source electrode SE and the drain electrode DE may contribute to forming the channel region.

Therefore, the amplitude of drain current $I_{sd}$ of the aforementioned TFT Tr is increased compared to that of the U-type transistor according to the related art, and thus, the TFT Tr may contribute to improving a charging rate. This will be described below.

According to the present embodiment, the source electrode SE and the drain electrode DE may alternately include lower layers SE1a, DE1a, SE2a, DE2a, SE3a, and DE3a and upper layers SE1b, DE1b, SE2b, DE2b, SE3b, and DE3b that are arranged on the lower layers SE1a, DE1a, SE2a, DE2a, SE3a, and DE3a, the lower layers SE1a, DE1a, SE2a, DE2a, SE3a, and DE3a including doped amorphous silicon and the upper layers SE1b, DE1b, SE2b, DE2b, SE3b, and DE3b including at least one metal layer.

Referring back to FIG. 3, from the left, the first source electrode branch SE1, the first drain electrode branch DE1, the second source electrode branch SE2, the second drain electrode branch DE2, the third source electrode branch SE3, and the third drain electrode branch DE3 are sequentially arranged over the active layer 50. The source electrode SE and the drain electrode DE may alternately include the lower layers SE1a, DE1a, SE2a, DE2a, SE3a, and DE3a and the upper layers SE1b, DE1b, SE2b, DE2b, SE3b, and DE3b arranged on the lower layers SE1a, DE1a, SE2a, DE2a, SE3a, and DE3a.

The lower layers SE1a, DE1a, SE2a, DE2a, SE3a, and DE3a of the source electrode SE and the drain electrode DE may include amorphous silicon doped with an impurity and thus have conductivity, e.g., may include $n^+$ amorphous silicon. The lower layers SE1a, DE1a, SE2a, DE2a, SE3a, and DE3a of the source electrode SE and the drain electrode DE may be ohmic contact layers that are arranged between the active layer 50 and the source and drain electrodes SE and DE and thus reduce a difference between work functions of the active layer 50 and the source and drain electrodes SE and DE. The lower layers SE1a, DE1a, SE2a, DE2a, SE3a, and DE3a of the source electrode SE and the drain electrode DE may include a metal layer including at least one of molybdenum (Mo), aluminum (Al), copper (Cu), and titanium (Ti), and according to the present embodiment, the lower layers SE1a, DE1a, SE2a, DE2a, SE3a, and DE3a may each be a double-layer of Ti/Cu or a triple-layer of Ti/Cu/Ti.

According to the present embodiment, the source electrode SE and the drain electrode DE may each contact the active layer 50. That is, the active layer 50 may directly contact each of the lower layers SE1a, DE1a, SE2a, DE2a, SE3a, and DE3a, and the lower layers SE1a, DE1a, SE2a, DE2a, SE3a, and DE3a may directly contact the upper layers SE1b, DE1b, SE2b, DE2b, SE3b, and DE3b, respectively.

According to the present embodiment, the LCD may include the storage capacitor $C_{st}$ including a lower electrode 32 and the upper electrode 60, wherein the lower electrode 32 is arranged at the same layer level as the gate electrode 30 and the upper electrode 60 extends from the drain electrode DE. Referring back to FIG. 3, the lower electrode 32 of the storage capacitor $C_{st}$ may be arranged at the same layer as the gate electrode 30. The lower electrode 32 and the gate electrode 30 may be concurrently or simultaneously formed by using a same material. In addition, unlike the gate electrode 30 connected to the gate line $GL_n$, the lower electrode 32 may have an island form. A capacitor voltage $V_{st}$ may be applied to the lower electrode 32 by a capacitor line.

The upper electrode 60 extending from the drain electrode connecting part $DE_{cn}$ may be arranged facing the lower electrode 32 on a plane. The upper electrode 60 may include a first layer 60a and a second layer 60b, wherein the first layer 60a includes amorphous silicon doped with an impurity and thus has conductivity, and the second layer 60b is arranged on the first layer 60a and includes at least one metal layer. According to the present embodiment, the first layer 60a may include $n^+$ amorphous silicon, and the second layer 60b may be a single layer or a multistack layer including a metal layer including at least one of Mo, Al, Cu, and Ti. In addition, the source electrode SE, the drain electrode DE, the drain electrode connecting part $DE_{cn}$, and the upper electrode 60 may be formed from the same material layer.

An insulating layer 70 is arranged on the source electrode SE and the drain electrode DE. The insulating layer 70 may cover the TFT Tr and the storage capacitor $C_{st}$. A step difference due to the TFT Tr and the storage capacitor $C_{st}$ may be planarized by the insulating layer 70. The insulating layer 70 may have a via hole 70H for exposing a portion of the upper electrode 60 of the storage capacitor $C_{st}$.

The pixel electrode 80 is arranged on the insulating layer 70. The pixel electrode 80 is electrically connected to the drain electrode DE. The pixel electrode 80 may fill the via hole 70H, thereby being electrically connected to the drain electrode DE. When the LCD includes storage capacitor $C_{st}$, the pixel electrode 80 may be electrically connected to the drain electrode DE via the upper electrode 60. The pixel electrode 80 may be independently arranged in each of a plurality of pixels included in the LCD.

Referring back to FIG. 2, the pixel electrode 80 may be divided into four sub-regions due to a horizontal branch part 80h extending in the first direction x and a vertical branch part 80v extending in the second direction y. Fine branch parts 80b may diagonally extend from the horizontal branch part 80h and the vertical branch part 80v, and an extending direction of each of the fine branch parts 80b may form an angle of about 45 or 135 degrees with the horizontal branch part 80h. However, the aforementioned shape of the pixel electrode 80 is an example, and the present disclosure is not limited thereto and may be variously changed.

As described above, the pixel electrode 80 defines the pixel region. When viewing the pixel electrode 80 from the top, there is a rectangle having a smallest area and contacting edges of the pixel electrode 80, and this rectangular area may be defined as the pixel region. Referring to FIG. 2, the pixel region has the first width W1 in the first direction x and the second width W2 in the second direction y. In this regard, the first width W1 is greater than the second width W2. That is, the pixel region refers to a rectangular region of which a side extending in the first direction x is a long side and of which a side extending in the second direction y is a short side. In this regard, the horizontal branch part 80h may have a width being substantially equal to the first width W1 of the pixel region, and the vertical branch part 80v may have a width being substantially equal to the second width W2 of the pixel region.

The liquid-crystal layer LC is arranged on the pixel electrode 80. In addition, the common electrode 90 that applies, with the pixel electrode 80, an electric field to the liquid-crystal layer LC may be arranged on the liquid-crystal layer LC. The common electrode 90 may face the pixel electrode 80 with the liquid-crystal layer LC arranged therebetween. That is, the common electrode 90 may be arranged on (i.e., under) a surface of an upper substrate 20, the surface facing the pixel electrode 80. In this case, an electric field may be formed in a vertical direction (e.g., a thickness direction of the LCD) due to different voltages applied to the pixel electrode 80 and the common electrode 90, and liquid crystals included in the liquid-crystal layer LC may be aligned according to the vertical direction.

However, the present disclosure is not limited thereto, and the common electrode 90 may be arranged on the base substrate 10 and to be insulated from the pixel electrode 80 that is also arranged on the base substrate 10. In this case, an electric field is formed in a horizontal direction (e.g., a lateral direction of the LCD) between the common electrode 90 and the pixel electrode 80, and the liquid crystals included in the liquid-crystal layer LC may be aligned according to the horizontal direction. That is, the pixel electrode 80 and the common electrode 90 may be variously arranged according to modes of driving the LCD.

Although not illustrated, in the LCD, an alignment layer for determining an alignment direction of liquid-crystal substances included in the liquid-crystal layer LC while an electric field is not applied to the liquid-crystal layer LC may be arranged at both top and bottom of the liquid-crystal layer LC.

The upper substrate 20 is arranged over the liquid-crystal layer LC. The LCD realizes an image toward the upper substrate 20, and may further include a backlight unit that is arranged in an opposite direction to the TFT Tr and the storage capacitor $C_{st}$ of the base substrate 10 and irradiates light through the base substrate 10 and toward the liquid-crystal layer LC.

Figure 6:
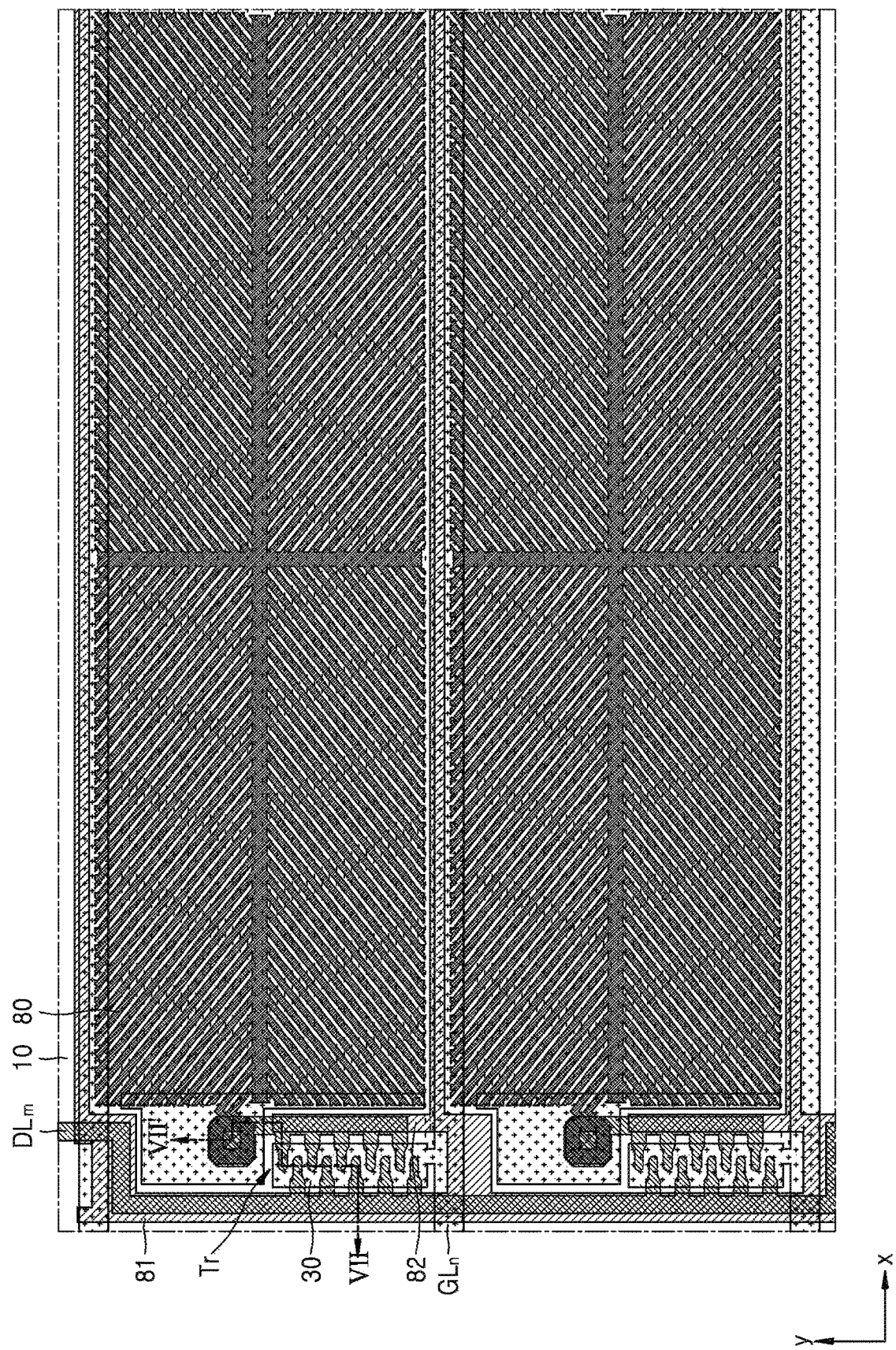
FIG. 6 is a plan view of an LCD, according to another embodiment.
Figure 7:
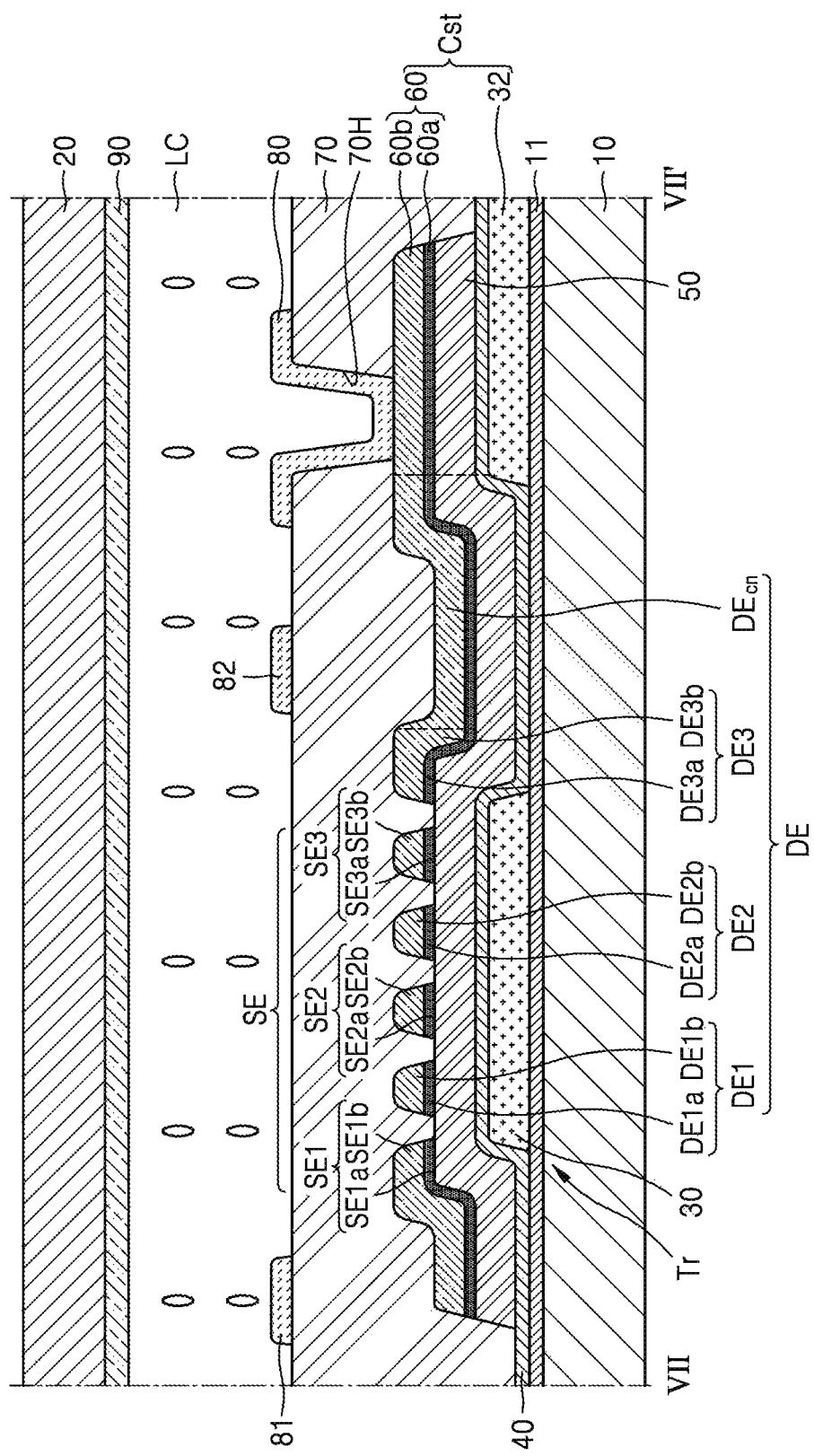
FIG. 7 is a cross-sectional view of the LCD, taken along line VII-VII' of FIG. 6.

FIG. 6 is a plan view of an LCD, according to another embodiment, and FIG. 7 is a cross-sectional view of the LCD, taken along line VII-VII' of FIG. 6.

Referring to FIGS. 6 and 7, the LCD according to the present embodiment may further include a first conductive layer 81 arranged at the same layer level as the pixel electrode 80 and having a portion that overlaps the data line $DL_m$. The first conductive layer 81 is arranged on the insulating layer 70 and is separate from the pixel electrode 80 on a plane. The first conductive layer 81 may be formed from the same material layer as the pixel electrode 80, and in this case, the first conductive layer 81 may be formed by using a photolithography process using one mask.

Referring to FIG. 6, the first conductive layer 81 may cover the data line $DL_m$ on a plane. A width of the first conductive layer 81 may be greater than a width of the data line $DL_m$, the width being perpendicular to a longitudinal direction. Accordingly, the data line $DL_m$ is covered by the first conductive layer 81 on a plane.

The first conductive layer 81 may not only cover an area of the data line $DL_m$ but may also cover an area of a gate line $GL_n$ or an area of the TFT Tr.

The LCD according to the present embodiment may further include a second conductive layer 82 arranged at the same layer level as the pixel electrode 80 and having a portion that overlaps the drain electrode connecting part $DE_{cn}$. In this regard, the first conductive layer 81 and the second conductive layer 82 may be electrically connected to each other.

Referring to FIGS. 6 and 7, the second conductive layer 82 is arranged on the insulating layer 70 and is separate from the pixel electrode 80 on a plane. In this regard, the second conductive layer 82 is arranged to cover a portion of the drain electrode connecting part $DE_{cn}$. The second conductive layer 82 may be formed from the same material layer as the pixel electrode 80, and in this case, the second conductive layer 82 may be formed by using a photolithography process using one mask.

In the LCD having the aforementioned structure, when a gate signal Gate is applied to the gate line $GL_n$, the TFT Tr is turned on. Thus, a data signal Data applied to the data line $DL_m$ is applied to the pixel electrode 80 via the TFT Tr. A voltage having a level different from that of a voltage applied to the pixel electrode 80 is applied to the common electrode 90, so that an electric field is formed between the pixel electrode 80 and the common electrode 90.

In this regard, a voltage having the same level as the common electrode 90 is applied to the first conductive layer 81 and/or the second conductive layer 82, so that an electric field is not formed between the common electrode 90 and the first conductive layer 81 and/or the second conductive layer 82. In an LCD according to the related art which does not include the first conductive layer 81 and/or the second conductive layer 82, liquid-crystal molecules in an edge area of a pixel, i.e., the liquid-crystal molecules being adjacent to the data line $DL_m$, are more likely to be misaligned since a fringe field between the pixel electrode 80 and the common electrode 90 is weak, and thus, light leakage occurs. However, according to the embodiment of FIGS. 6 and 7, even if a fringe field between the pixel electrode 80 and the common electrode 90 is weak, an electric field is not formed in an area where the first conductive layer 81 and/or the second conductive layer 82 is formed, and thus, misalignment of liquid-crystal molecules in an edge area of a pixel is prevented. As a result, light leakage may be decreased, and an area of a black matrix arranged to prevent the light leakage may be decreased, and accordingly, an aperture ratio of the LCD is increased.

Figure 8:
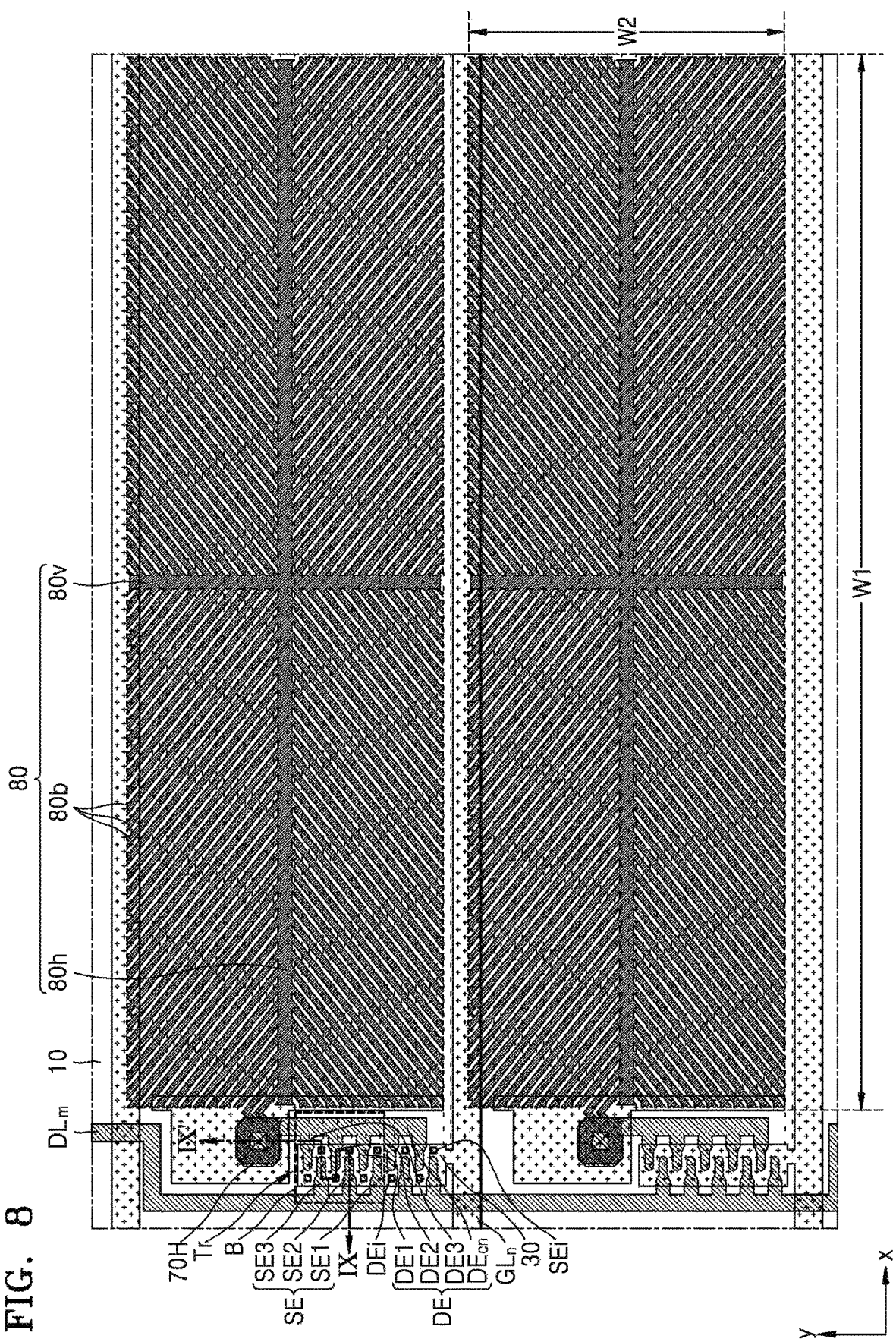
FIG. 8 is a plan view of an LCD, according to another embodiment.
Figure 9:
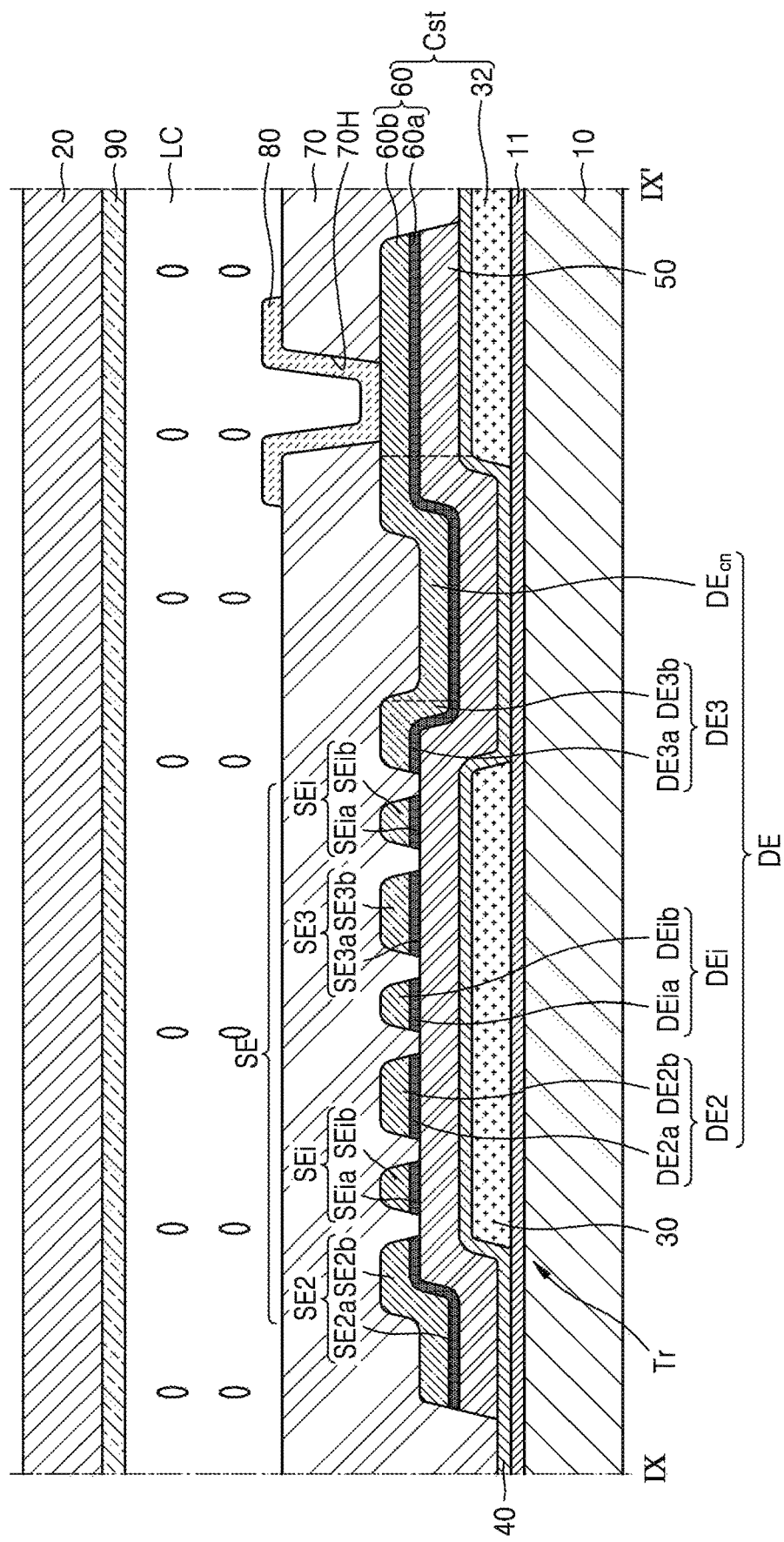
FIG. 9 is a cross-sectional view of the LCD, taken along line IX-IX' of FIG. 8.
Figure 10:
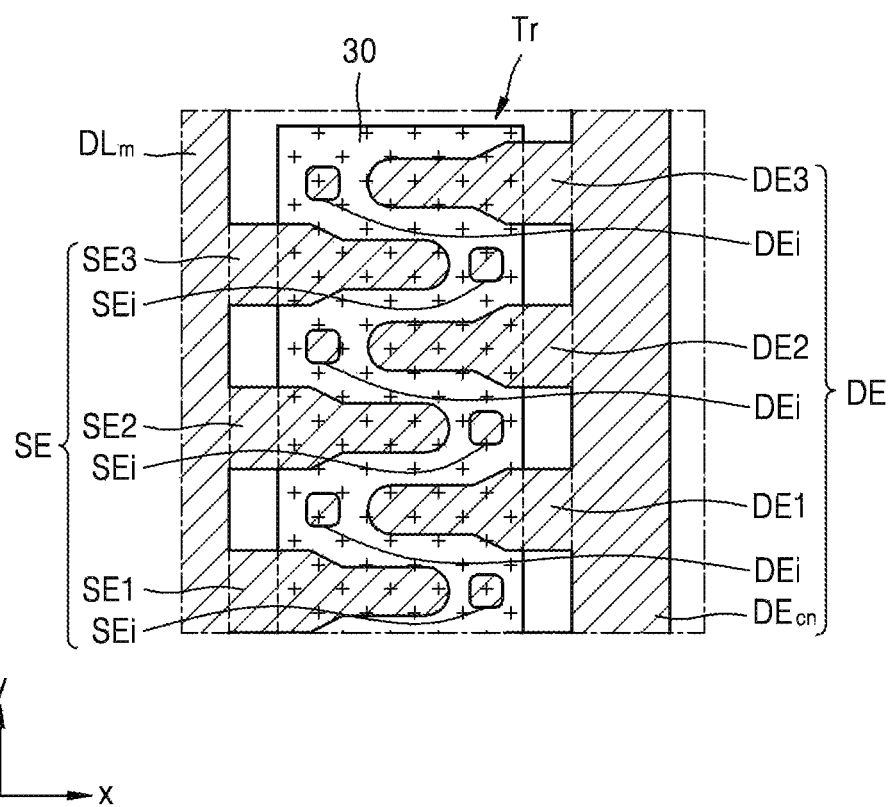
FIG. 10 is a magnified plan view of a portion B of FIG. 8.

FIG. 8 is a plan view of an LCD, according to another embodiment, FIG. 9 is a cross-sectional view of the LCD, taken along line IX-IX' of FIG. 8, and FIG. 10 is a magnified plan view of a portion B of FIG. 8.

Referring to FIGS. 8 through 10, in the LCD according to the present embodiment, the source electrode SE may further include a plurality of source electrode islands SEi that are separate from the source electrode branches SE1, SE2, and SE3 and alternate with the drain electrode branches DE1, DE2, and DE3, and the drain electrode DE may further include a plurality of drain electrode islands DEi that are separate from the drain electrode branches DE1, DE2, and DE3 and alternate with the source electrode branches SE1, SE2, and SE3.

The source electrode islands SEi respectively overlap the source electrode branches SE1, SE2, and SE3 protruding from the data line $DL_m$ in a first direction x. Each of the source electrode islands SEi is separate from the source electrode branches SE1, SE2, and SE3 and has an island form. The source electrode islands SEi are arranged while alternating with the drain electrode branches DE1, DE2, and DE3.

The drain electrode islands DEi respectively overlap the drain electrode branches DE1, DE2, and DE3 protruding from the drain electrode connecting part $D_{Ecn}$ in the first direction x. Each of the drain electrode islands DEi is separate from the drain electrode branches DE1, DE2, and DE3 and has an island form. The drain electrode islands DEi are arranged while alternating with the source electrode branches SE1, SE2, and SE3. Referring to FIG. 8, five source electrode islands SEi and five drain electrode islands DEi are illustrated as an example, but the present disclosure is not limited thereto.

According to the present embodiment, the source electrode islands SEi and the drain electrode islands DEi may overlap the gate electrode 30 on a plane. A channel region of the active layer 50 is formed between each source electrode island SEi and each drain electrode island DEi, and in this regard, when the gate electrode 30 overlaps the channel region on a plane, leakage current due to light is prevented so that an efficiency of the TFT Tr may be improved.

According to the present embodiment, the source electrode islands SEi and the drain electrode islands DEi may be arranged at regular intervals. Each source electrode island SEi may be arranged at the center between any two of the drain electrode branches DE1, DE2, and DE3, and each drain electrode island DEi may be arranged at the center between any two of the source electrode branches SE1, SE2, and SE3. The source electrode islands SEi and the drain electrode islands DEi may each have a same size and shape. Referring to FIGS. 8 and 10, each of the source electrode islands SEi and drain electrode islands DEi has a quadrangular shape of which corners are round.

The amplitude of drain current $I_{sd}$ of the aforementioned TFT Tr including the source electrode islands SEi and the drain electrode islands DEi is increased compared to that of the U-type transistor according to the related art, and thus, the TFT Tr may contribute to improving a charging rate. This will be described below.

Hereinafter, with reference to FIGS. 11 through 13 and [Table 1], a voltage-current characteristic of the TFT Tr of the present disclosure will now be described.

Figure 11:
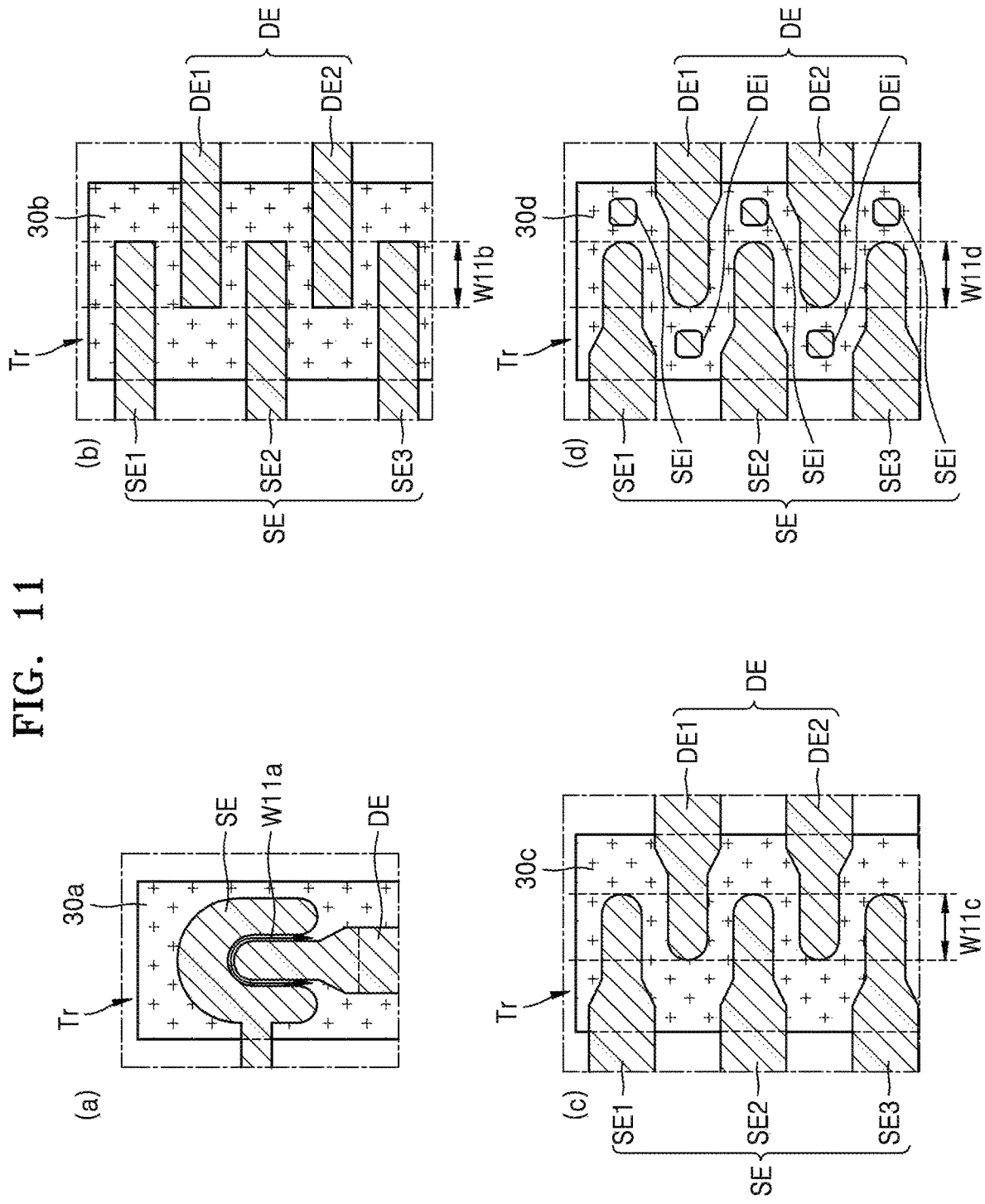
FIG. 11 illustrates plan views of a thin-film transistor (TFT) of a comparative example and TFTs of first through third embodiments.

FIG. 11 illustrates plan views of a TFT Tr of a comparative example and TFTs Tr of first through third embodiments. The comparative example in (a) of FIG. 11 corresponds to the U-type transistor according to the related art, the first embodiment in (b) of FIG. 11 corresponds to the TFT Tr including rectangle-shaped source electrode branches SE1, SE2, and SE3 and drain electrode branches DE1 and DE2, the second embodiment in (c) of FIG. 11 corresponds to the TFT Tr including bowling pin-shaped source electrode branches SE1, SE2, and SE3 and drain electrode branches DE1 and DE2, and the third embodiment in (d) of FIG. 11 corresponds to the TFT Tr of the second embodiment which further includes source electrode islands SEi and drain electrode islands DEi. In (a) through (d) of FIG. 11, three source electrode branches SE1, SE2, and SE3 and two drain electrode branches DE1 and DE2 are illustrated as an example.

In addition, gate electrodes 30a, 30b, 30c, and 30d are respectively arranged below a source electrode SE and drain electrode DE of the comparative example and the first through third embodiments. Each of the gate electrodes 30a, 30b, 30c, and 30d overlaps a channel region formed between the source electrode SE and the drain electrode DE, so that leakage current due to light may be prevented and thus an efficiency of the TFT Tr may be increased.

In the comparative example in (a) of FIG. 11, a width (i.e., a parameter line) W11a of the channel region (that is between the source electrode SE and the drain electrode DE and has a reverse U-shape in the drawing) is 35 μm. In the first through third embodiments in (b) through (d) of FIG. 11, widths W11b, W11c, and W11d of the channel regions between the source electrode branches SE1, SE2, and SE3 and the drain electrode branches DE1 and DE2 are each 8.75 μm. In each of (b) through (d) of FIG. 11, four channel regions are formed between the source electrode branches SE1, SE2, and SE3 and the drain electrode branches DE1 and DE2, thus, a width of all of the channel regions is 35 μm.

Figure 12:
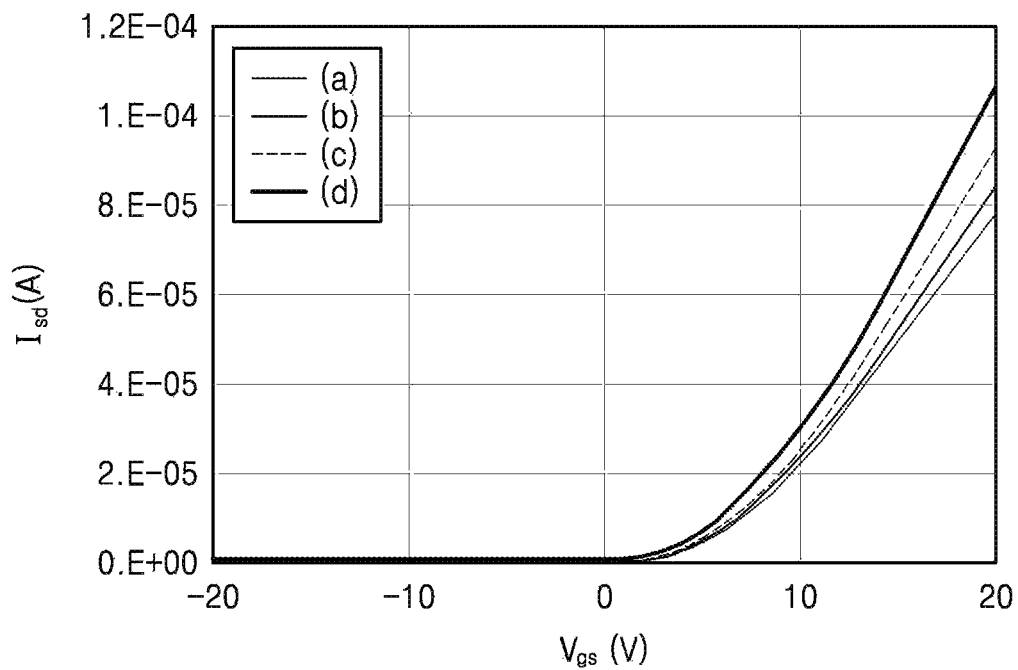
FIG. 12 is a graph of a test on the TFT, in which the TFT of each, of the comparative example and the first through third embodiments, was in a photo state where the TFT was exposed to light with intensity of 6000 cd/m², and then was examined for a gate voltage-drain current characteristic.

FIG. 12 is a graph of a test on the TFT Tr, in which the TFT Tr of each of the comparative example and the first through third embodiments was in a photo state where the TFT Tr was exposed to light with intensity of 6000 cd/m$^2$, and then was examined for a gate voltage $V_{gs}$-drain current $I_{sd}$ characteristic. FIG. 13 is a graph of a test on the TFT Tr, in which the TFT Tr of each of the comparative example and the first through third embodiments was in a dark state where the TFT Tr was not exposed to light, and then was examined for the gate voltage $V_{gs}$-drain current $I_{sd}$ characteristic. In this regard, the drain current $I_{sd}$ refers to current flowing between the source electrode SE and the drain electrode DE.

Figure 13:
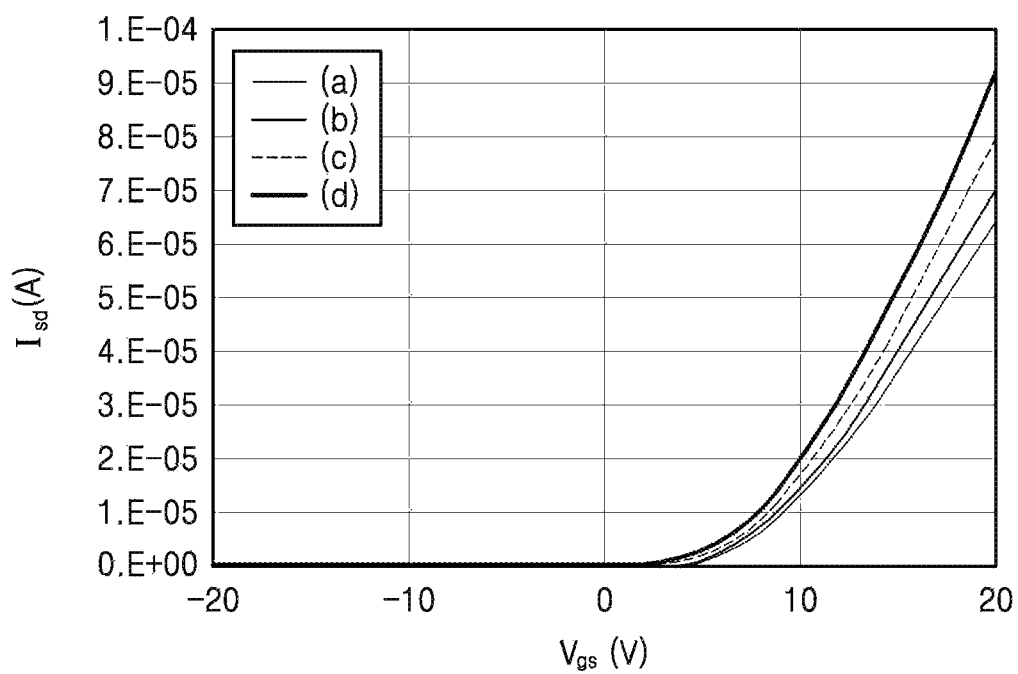
FIG. 13 is a graph of a test on the TFT, in which the TFT of each, of the comparative example and the first through third embodiments, was in a dark state where the TFT was not exposed to light, and then was examined for the gate voltage-drain current characteristic.

Comparing the graphs of the comparative example (in (a) of FIG. 11) with the first embodiment (in (b) of FIG. 11) of FIGS. 12 and 13, in both the photo state and the dark state, a value of the drain current $I_{sd}$ of the first embodiment was increased compared to the U-type comparative example. As in the comparative example according to the related art, when the drain electrode DE has a flat shape and the source electrode SE with a U-shape surrounds the flat shape, only an inner portion of the source electrode SE which faces the drain electrode DE contributes to forming the channel region, and an outer portion thereof does not contribute to forming the channel region. Unlike the related art, as in the first embodiment, when the source electrode branches SE1, SE2, and SE3 and the drain electrode branches DE1 and DE2 are alternately arranged, most portions of the source electrode SE and the drain electrode DE may contribute to forming the channel region. Thus, even if the channel regions have a same length, the value of the drain current $I_{sd}$ of the first embodiment becomes greater than a value of the drain current $I_{sd}$ of the comparative example.

Comparing the graphs of the tests on the first embodiment and the second embodiment (in (c) of FIG. 11) of FIGS. 12 and 13, in both the photo state and the dark state, a value of the drain current $I_{sd}$ of the second embodiment was increased compared to the first embodiment. As in the second embodiment, when the source electrode branches SE1, SE2, and SE3 and the drain electrode branches DE1 and DE2 are bowling pin-shaped, a width of each channel region becomes small. Therefore, a space may be efficiently used so that the value of the drain current $I_{sd}$ may become large without decreasing an aperture ratio.

Comparing the graphs of the tests on the second embodiment and the third embodiment (in (d) of FIG. 11) of FIGS. 12 and 13, in both the photo state and the dark state, a value of the drain current $I_{sd}$ of the third embodiment was increased compared to the second embodiment. As in the third embodiment, when the source electrode islands SEi and the drain electrode islands DEi are included in the TFT Tr, a width of each channel region is increased, thus, even if the channel regions have a same length, the value of the drain current $I_{sd}$ of the third embodiment becomes greater than the value of the drain current $I_{sd}$ of the second embodiment.

Thus, since the value of the drain current $I_{sd}$ in each of the TFTs Tr according to the first through third embodiments is increased compared to that of the U-type transistor of the comparative example, the TFT Tr according to each of the first through third embodiments may contribute to improving a charging rate.

With reference to FIGS. 12 and 13, [Table 1] shows a rate of increase in the drain current $I_{sd}$ in each of the first through third embodiments compared to the drain current $I_{sd}$ in the comparative example when the TFT Tr is turned on due to a same gate voltage $V_{gs}$ of 20 V.

TABLE 1

| Shape of TFT | Exposed State Rate of Increase in Current (%) | |
| --- | --- | --- |
| | Photo | Dark |
| (a) of FIG. 11: comparative example | — | — |
| (b) of FIG. 11: first embodiment | +8.8 | +7.4 |
| (c) of FIG. 11: second embodiment | +23.8 | +19.5 |
| (d) of FIG. 11: third embodiment | +42.3 | +35.5 |

Referring to [Table 1], it is apparent that a value of the drain current $I_{sd}$ in the TFT Tr according to each of the first through third embodiments is increased compared to that of the U-type transistor of the comparative example. Thus, the TFT Tr according to each of the first through third embodiments may contribute to improving a charging rate.

The one or more embodiments may provide an LCD including a TFT having an improved charging rate, in which parasitic capacitance between a gate electrode and a source electrode and parasitic capacitance between the gate electrode and a drain electrode are reduced so that a delay of a gate line is decreased. However, the scope of the present disclosure is not limited to the one or more embodiments.

While one or more embodiments have been described with reference to the figures, it will be understood by one of ordinary skill in the art that various changes in form and details may be made therein without departing from the spirit and scope as defined by the following claims, and equivalents thereof.

What is claimed is:

1. A liquid-crystal display comprising:
   a gate line having a length in a first direction;
   a gate electrode protruding from the gate line;
   a gate insulating layer arranged on the gate electrode;
   an active layer arranged on the gate insulating layer and insulated from the gate electrode, the active layer comprising a semiconductor material;
   a data line arranged on the active layer and having a length in a second direction crossing the first direction;
   a source electrode protruding from the data line, having a portion overlapping the gate electrode on a plane, and comprising:
      a plurality of source electrode branches that are separate from each other; and
      a plurality of source electrode islands that are separate from the plurality of source electrode branches;
   a drain electrode separate from the source electrode, and comprising:
      a plurality of drain electrode branches, each being arranged between two of the plurality of source electrode branches;
      a plurality of drain electrode islands separate from the plurality of drain electrode branches; and
      a drain electrode connecting part connecting the plurality of drain electrode branches;
   a pixel electrode defining a pixel region having a first width in the first direction and a second width in the second direction, the second width being less than the first width, and arranged on the drain electrode so as to be electrically connected to the drain electrode;
   a liquid-crystal layer arranged on the pixel electrode; and
   a storage capacitor comprising a lower electrode and an upper electrode, the lower electrode being arranged at the same layer level as the gate electrode and the upper electrode extends from the drain electrode,
   wherein the plurality of source electrode islands alternate with the plurality of drain electrode branches, and the plurality of drain electrode islands alternate with the plurality of source electrode branches,
   wherein the active layer extends under the drain electrode connecting part to be between the lower electrode and the upper electrode of the storage capacitor,
   wherein each of the plurality of source electrode branches comprises a first source electrode region being adjacent to the data line and having a third width, and a second source electrode region extending from the first source electrode region and having a fourth width, the fourth width being less than the third width,
   wherein each of the plurality of drain electrode branches comprises a first drain electrode region being adjacent to the drain electrode connecting part and having a fifth width, and a second drain electrode region extending from the first drain electrode region and having a sixth width, the sixth width being less than the fifth width, and
   wherein the third width of the first source electrode region and the fifth width of the first drain electrode region have substantially the same value, and the fourth width of the second source electrode region and the sixth width of the second drain electrode region have substantially the same value wherein the plurality of source electrode islands and the plurality of drain electrode islands overlap the gate electrode on the plane.

2. The liquid-crystal display of claim 1, wherein the active layer comprises amorphous silicon.

3. The liquid-crystal display of claim 1, wherein the plurality of source electrode branches are arranged while alternating with the plurality of drain electrode branches.

4. The liquid-crystal display of claim 1, wherein the plurality of source electrode branches and the plurality of drain electrode branches are arranged at regular intervals.

5. The liquid-crystal display of claim 1, wherein the drain electrode connecting part and the data line do not overlap the gate electrode on a plane.

6. The liquid-crystal display of claim 1, wherein
   the drain electrode connecting part extends in the second direction, and
   the plurality of source electrode branches protrude from the data line in the first direction, and the plurality of drain electrode branches protrude from the drain electrode connecting part in the first direction.

7. The liquid-crystal display of claim 1, wherein the second source electrode region and the second drain electrode region overlap the gate electrode on the plane.

8. The liquid-crystal display of claim 1, wherein the second drain electrode region does not extend to overlap the first source electrode region in the second direction, and the second source electrode region does not extend to overlap the first drain electrode region in the second direction.

9. The liquid-crystal display of claim 1, wherein each of the source electrode and the drain electrode comprises:
   a lower layer comprising doped amorphous silicon; and
   an upper layer arranged on the lower layer, and comprising at least one metal layer.

10. The liquid-crystal display of claim 1, wherein each of the source electrode and the drain electrode directly contacts the active layer.

11. The liquid-crystal display of claim 1, further comprising a first conductive layer arranged at the same layer level as the pixel electrode and having a portion that overlaps the data line.

12. The liquid-crystal display of claim 11, further comprising a second conductive layer arranged at the same layer level as the pixel electrode and having a portion that overlaps the drain electrode connecting part.

13. The liquid-crystal display of claim 12, wherein the first conductive layer and the second conductive layer are electrically connected to each other.

14. The liquid-crystal display of claim 1, wherein the plurality of source electrode islands and the plurality of drain electrode islands are arranged at regular intervals.

* * * * *